United States Patent [19]
Matsui et al.

[11] Patent Number: 5,278,459
[45] Date of Patent: Jan. 11, 1994

[54] STATIC SEMICONDUCTOR MEMORY USING THIN FILM FET

[75] Inventors: Masataka Matsui, Tokyo; Kiyofumi Ochii; Katsuhiko Sato, both of Yokohama, all of Japan

[73] Assignee: Kabushiki Kaisha Toshiba, Kawasaki, Japan

[21] Appl. No.: 791,695

[22] Filed: Nov. 14, 1991

[30] Foreign Application Priority Data

Nov. 15, 1990 [JP] Japan ................ 2-307308

[51] Int. Cl.$^5$ ............................................ H03K 3/356
[52] U.S. Cl. ........................... 307/291; 307/279; 365/154; 257/369; 257/903
[58] Field of Search .............. 307/279, 291, 298; 257/369, 903; 365/154

[56] References Cited

U.S. PATENT DOCUMENTS

| | | | |
|---|---|---|---|
| 4,045,686 | 8/1977 | Masuda | 307/279 |
| 4,130,892 | 12/1978 | Gunckel et al. | 307/279 |
| 4,740,714 | 4/1988 | Musaki et al. | 307/279 |
| 4,980,732 | 12/1990 | Okazawa | 257/369 |
| 5,134,581 | 7/1992 | Ishibashi et al. | 365/154 |
| 5,157,474 | 10/1992 | Ochii | 365/154 |

*Primary Examiner*—John S. Heyman
*Attorney, Agent, or Firm*—Finnegan, Henderson, Farabow, Garrett & Dunner

[57] ABSTRACT

According to this invention, there is provided a semiconductor static data memorizing apparatus including, a first power supply terminal, a second power supply terminal, a first TFT (thin film transistor), the first TFT having a first conductivity type, one terminal connected to the first power supply terminal, and the other terminal connected to a first data storage node for memorizing the second data, a second TFT, the TFT having the first conductivity type, one terminal connected to the first power supply terminal, and the other terminal connected to a second data storage node for memorizing the data, a third TFT, the third TFT having a second conductivity type, one terminal connected to the second power supply terminal, and the other terminal connected to the first data storage node, and a fourth TFT, the fourth TFT having the second conductivity type, one terminal connected to the second power supply terminal, and the other terminal connected to the second data storage node, wherein a gate of the first TFT is connected to the second memory node, and a gate of the second TFT is connected to the first data storage node, such that a flip-flip circuit is formed by the first power supply terminal, the second power supply terminal, the first TFT, the second TFT, the third TFT, and the fourth TFT, and further including data bit lines which are inverted with respect to each other, a first switching device for performing a switching operation between one of the bit lines and the first data storage node, a second switching device for performing a switching operation between the other of the data bit lines and the second data memory, and a word line device, connected to gates of the first and second switching devices, for controlling operations of the first and second switching devices.

14 Claims, 10 Drawing Sheets

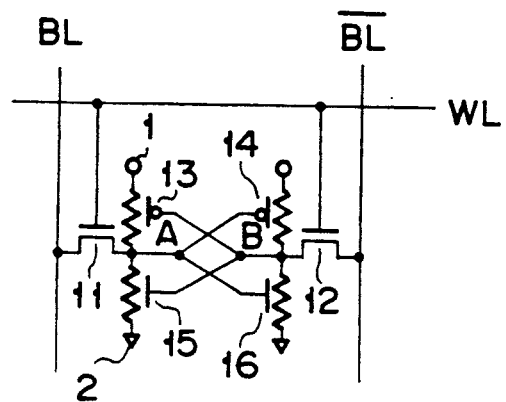
F I G. 1
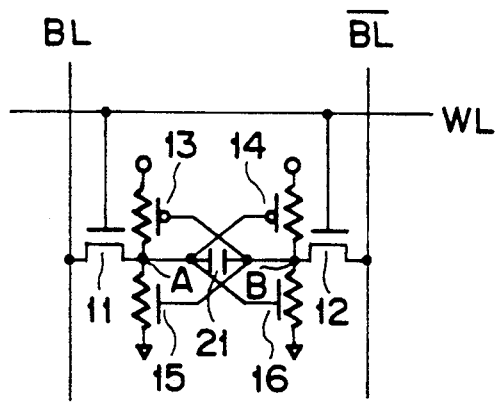
F I G. 2
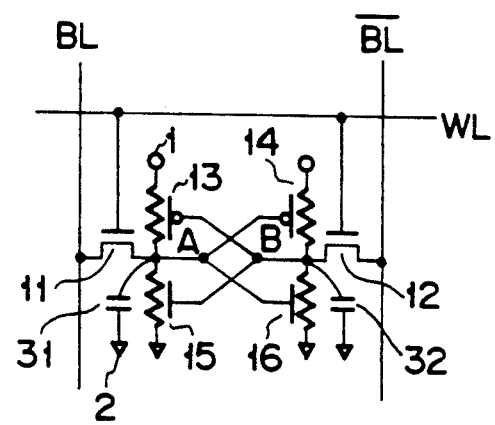
F I G. 3

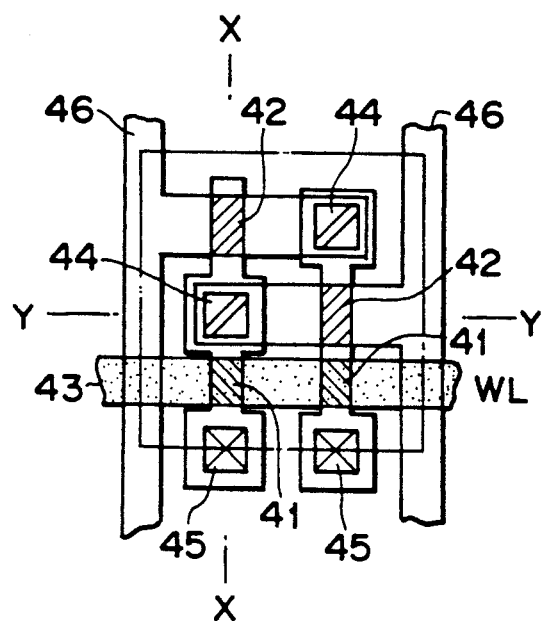
F I G. 4A
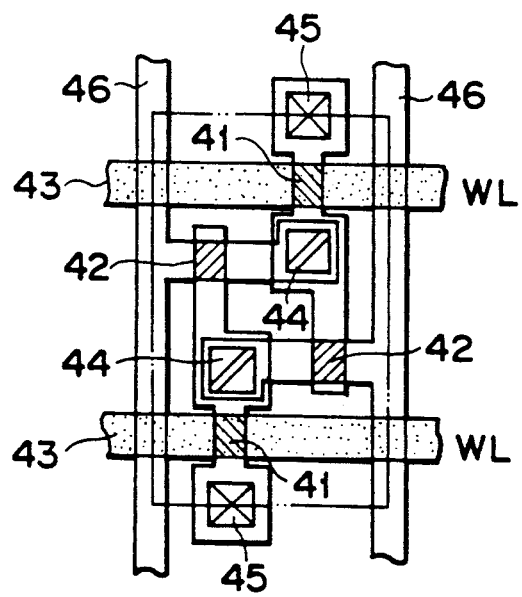
F I G. 5

STATIC SEMICONDUCTOR MEMORY USING THIN FILM FET

BACKGROUND OF THE INVENTION

1. Field of the Invention

The present invention relates to a static memory cell and, more particularly, to a static random access memory (referred to as an SRAM hereinafter) requiring no data refresh.

2. Description of the Related Art

In general, unlike a dynamic random access memory (DRAM) in which data is updated (refreshed) every predetermined period, a static memory requiring no data refresh can be easily used. In addition, when the static memory is combined with a CMOS technique, a random access memory backed up by a battery having a low standby power can be obtained. However, in this case, since a flip-flop must be formed in a memory cell, the cell area of the static random access memory is larger than that of the DRAM.

In an SRAM to which the present invention is not applied, since a CMOS structure must be independently formed in a memory cell, the cell area is six times or more than that of the DRAM.

According to another method, four transistors must be integrated in a cell, and an NMOSFET has a driving ability of several mA. Therefore, since the resistance of the ground power supply line of the cell must be decreased, a low-resistance wiring material such as polycide must be used, and difficult processing must be performed.

SUMMARY OF THE INVENTION

It is an object of the present invention to provide a static memory cell in which the number of transistors formed on a silicon substrate is reduced to extremely decrease the cell area, such that improved retention characteristics and high stability can be obtained.

According to the present invention, there is provided a semiconductor static data memorizing apparatus comprising, a first power supply terminal, a second power supply terminal, a first TFT (thin film transistor), the first TFT having a first conductivity type, one terminal connected to the first power supply terminal, and the other terminal connected to a first data storage node for memorizing the data, a second TFT, the TFT having the first conductivity type, one terminal connected to the first power supply terminal, and the other terminal connected to a second data storage node for memorizing the data, a third TFT, the third TFT having a second conductivity type, one terminal connected to the second power supply terminal, and the other terminal connected to the first data storage node, and a fourth TFT, the fourth TFT having the second conductivity type, one terminal connected to the second power supply terminal, and the other terminal connected to the second data storage node, wherein a gate of the first TFT is connected to the second data storage node, and a gate of the second TFT is connected to the first data storage node, such that a flip-flip circuit is formed by the first power supply terminal, the second power supply terminal, the first TFT, the second TFT, the third TFT, and the fourth TFT; and further comprising, data bit lines which are inverted to each other, first switching means for performing a switching operation between one of the bit lines and the first data storage node, second switching means for performing a switching operation between the other of the data bit lines and the second data memory, and word line means, connected to gates of the first and second switching means, for controlling operations of the first and second switching means.

According to the present invention, a flip-flop circuit using TFTs is obtained with the above arrangement. Unlike in a conventional technique, all circuits are not arranged on a silicon wafer, and transistors other than given transistors are formed on the given transistors. Therefore, the above circuit can be three-dimensionally formed, and a static memory cell having a small cell area can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing an embodiment of the present invention;

FIGS. 2 and 3 are circuit diagrams showing another embodiment of the present invention;

FIG. 4A is a view of a pattern showing the embodiment (e.g., FIG. 1) of the present invention;

FIG. 5 is a view showing a pattern of still another embodiment of the present invention;

DETAILED DESCRIPTION OF THE PREFERRED EMBODIMENTS

Figure 4B:
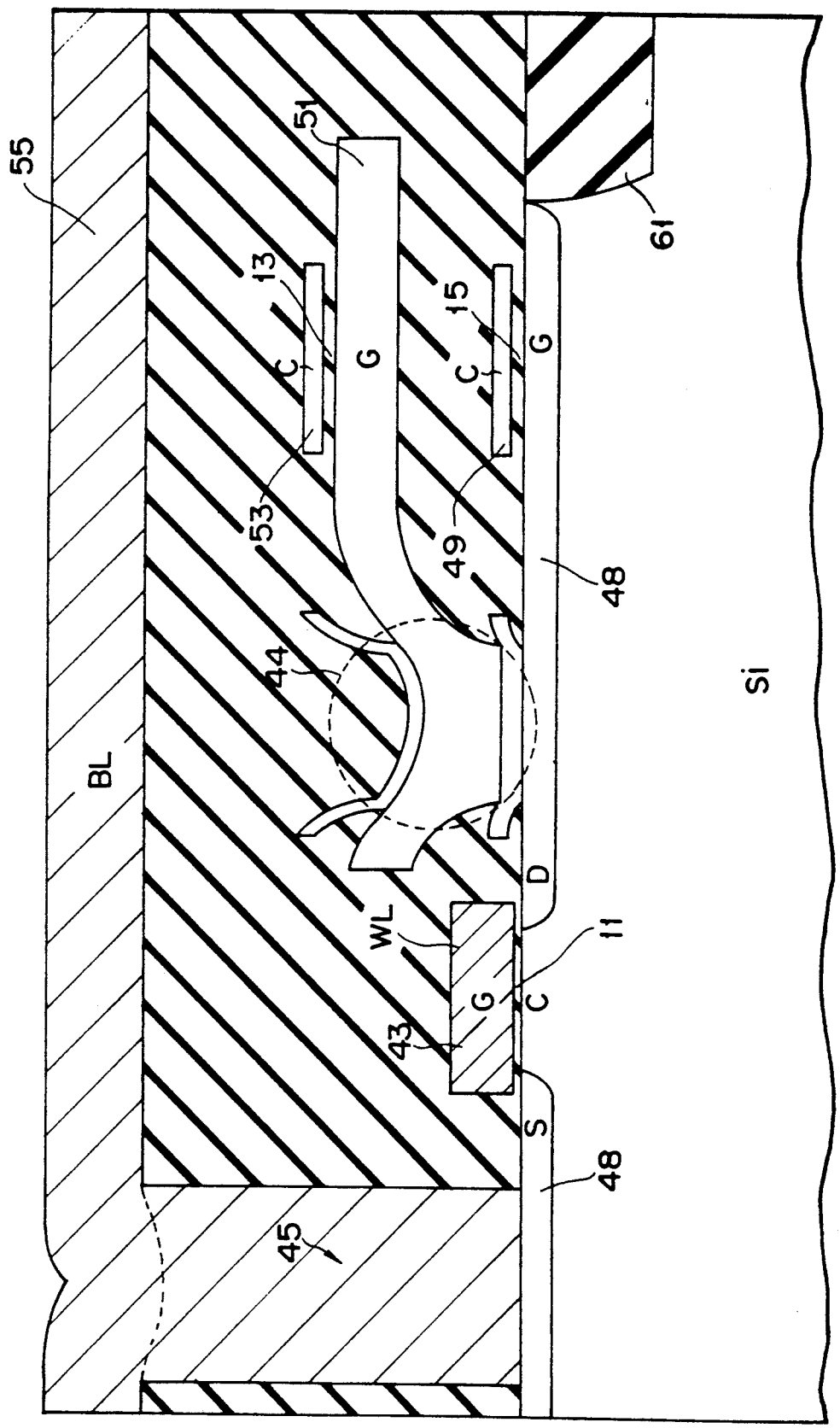
FIGS. 4B to 4E are plan and sectional views showing the embodiment of the present invention.

Embodiments of the present invention will be described below with reference to the accompanying drawings.

FIG. 1 is a circuit diagram showing a static memory cell according to an embodiment of the present invention. In FIG. 1, reference numerals 11 and 12 denote n-type access transistors, serving as transfer gates and being selectively controlled by a word line WL, for connecting a pair of bit lines BL and $\overline{BL}$ to inner nodes A and B serving as data storage nodes of a flip-flop. Reference numerals 13 and 14 denote p-type TFTs, and reference numerals 15 and 16 denote n-type TFTs. A flip-flop is formed such that the gates of the TFTs 13 and 15 are connected to the inner node B and such that the gates of the TFTs 14 and 16 are connected to the inner node A. As described above, since the TFTs are used as all four transistors constituting the flip-flop, only the two access transistors 11 and 12 are sufficient as transistors formed on an Si substrate. The p-type TFTs 13 and 14 and the n-type TFTs 15 and 16 are three-dimensionally formed such that polysilicon is deposited on the NMOSs (transfer gates) 11 and 12. Thus, the cell area can be made smaller than that of a conventional static memory cell. In addition, since the flip-flop is constituted by TFTs, cell driving power is reduced, and cell current is decreased to about 10 pA to 1 nA even though conventional cell current is several 100 μA. Therefore, the resistance of the power supply line can be increased. The standby current can be suppressed to the same level as that of conventional small standby current due to the use of the TFTs.

FIG. 2 is a circuit diagram showing a static memory cell according to another embodiment of the present invention. As is described in the embodiment of FIG. 1, since cell driving power is reduced, the potential difference between the bit lines BL and $\overline{BL}$ during read access is decreased, and read-access time may be prolonged. For this reason, as shown in FIG. 2, a capacitor 21 having inner nodes A and B as its terminals is provided, and a charge is stored in the capacitor 21. Therefore, a larger bit line potential difference can be obtained by dividing the charge between the capacitor 21 and a bit line capacitance.

FIG. 3 is a circuit diagram showing a static memory according to still another embodiment of the present invention. In this embodiment, capacitors 31 and 32 are respectively arranged between an inner node A and a ground potential 2 and between an inner node B and the ground potential 2, and a large amount of charge is stored in these capacitors to cause memory data to be hard to be broken, such that a large potential difference between bit lines is obtained. When the capacitors 31 and 32 are arranged between the inner nodes A and B and a power supply 1, the same effect as described above can be obtained. In addition, when an arrangement obtained by combining the arrangements shown in FIGS. 2 and 3 is used, the same effect as described above can also be obtained.

Figure 4C:
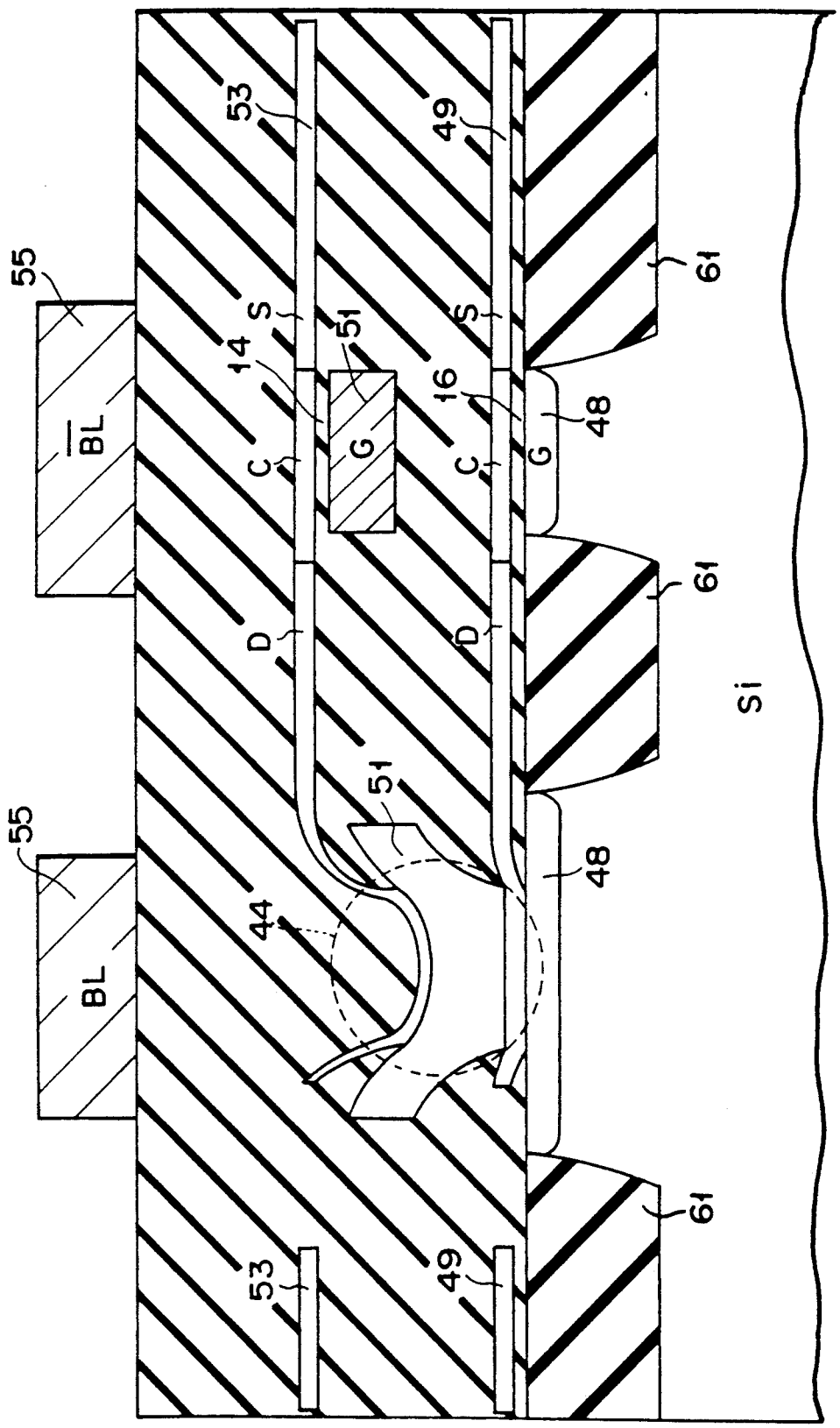

FIG. 4A shows a pattern layout of a static memory cell according to an embodiment (e.g., shown in FIG. 1) of the present invention. FIG. 4B is a sectional view along a line X — X in FIG. 4A, and FIG. 4C is a sectional view along a line Y — Y in FIG. 4A. In FIGS. 4A, 4B and 4C, reference numerals 41 denote the channels of transfer gates, and reference numerals 42 denote the channels of TFTs. When viewed from the above, a p-type TFT and an n-type TFT overlap each other. In addition, reference numeral 43 denotes a word line constituted by a first polysilicon layer; 44, buried contacts; 45, wiring contacts, and 46, power supply lines consisting of a power line and a ground line which overlap each other when viewed from the top. Reference numeral 47 denotes a p-type Si substrate; 48, an n+-type diffusion layer; 49, a second polysilicon layer prospectively serving as a substrate layer on which the source/drain of the TFT is formed; 50, a gate insulating film; 51, a third polysilicon layer prospectively serving as the gate layer of the TFT; 52, a gate insulating film; 53, a fourth polysilicon layer; and 55, a metal layer.

In FIG. 4B, reference numerals 11, 13, and 15 denote portions corresponding to the transistors 11, 13, and 15 in FIG. 1. In FIG. 4C, reference numerals 14 and 16 denote portions corresponding to the transistors 14 and 16 in FIG. 1. Reference symbols G, S, D, and C denote a gate, a source, a drain, and a channel section, respectively. Reference numeral 61 denotes a buried oxide film for insulating devices from each other. Other reference numerals in FIG. 4B denote the same parts as in the foregoing drawings.

Figure 4D:
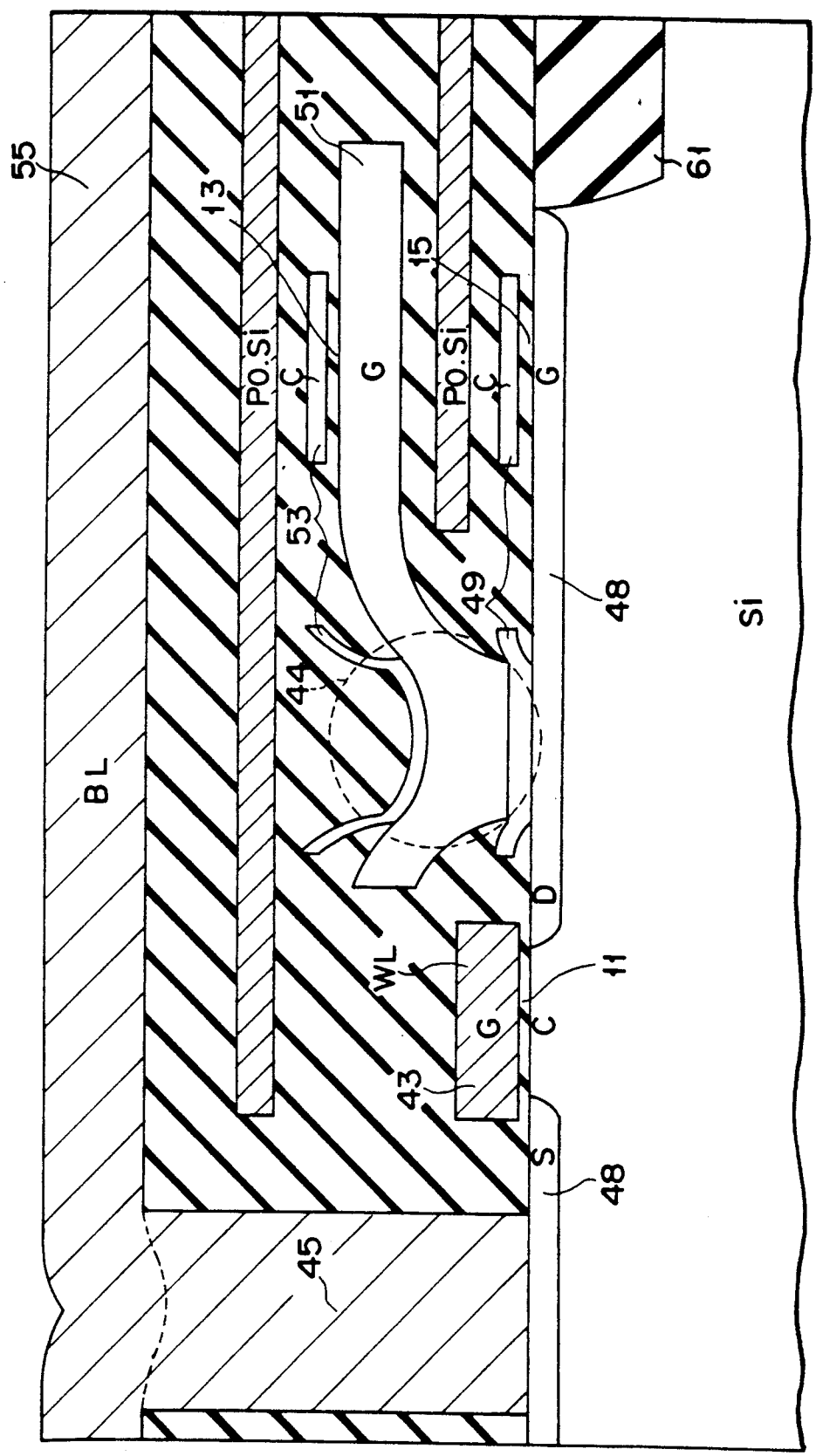
Figure 4E:
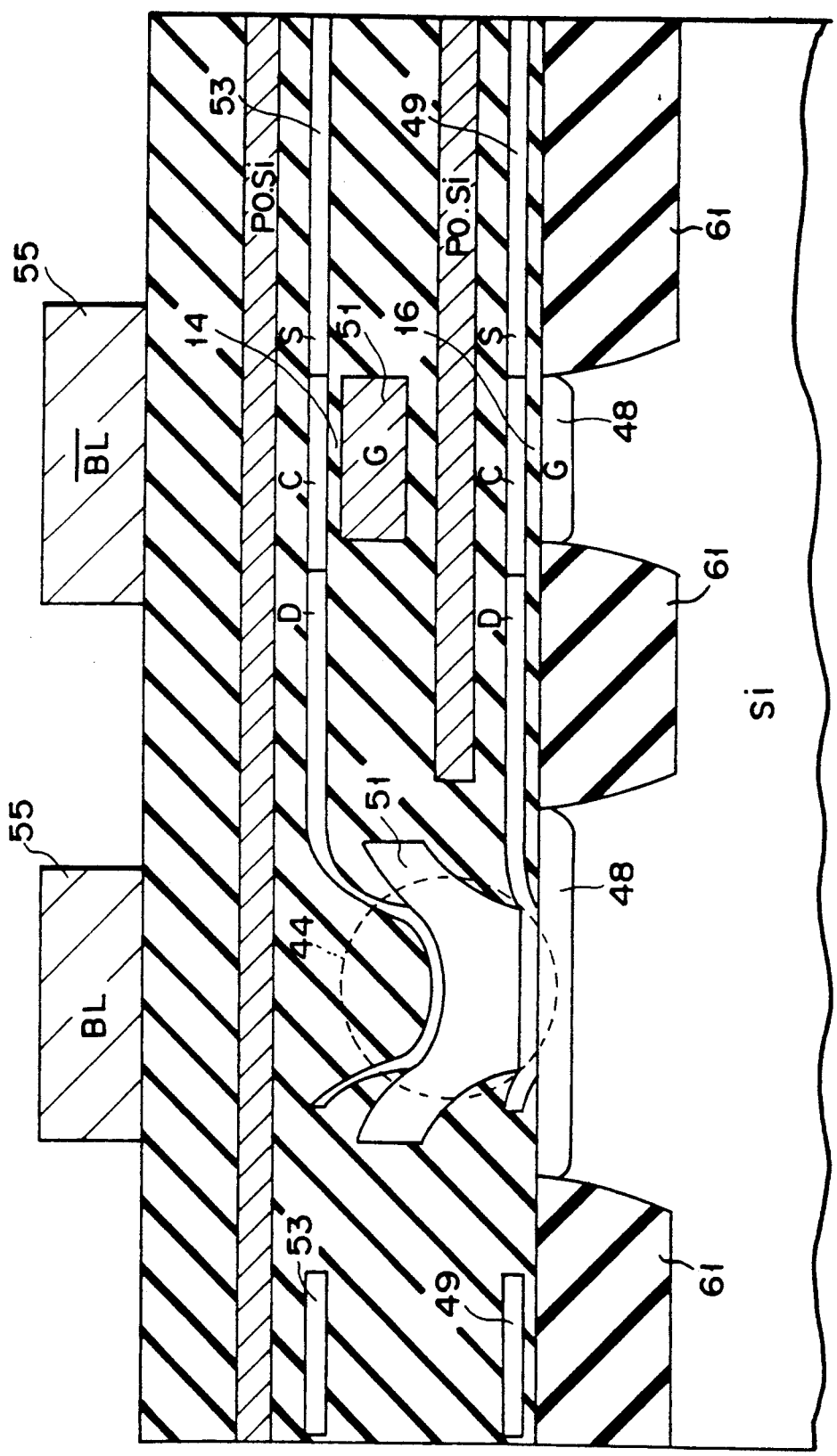

FIG. 4D is an X-direction sectional view of a pattern layout (not shown) showing a static memory cell according to the embodiment having the capacitors in FIG. 3, and FIG. 4E is a Y-direction sectional view thereof. In FIG. 4D, reference numerals 11, 13, and 15 denote portions corresponding to the transistors 11, 13, and 15 in FIG. 1. In FIG. 4E, reference numerals 14 and 16 denote portions corresponding to the transistors 14 and 16 in FIG. 1, and reference symbols G, S, D, and C denote a gate, a source, a drain, and a channel section, respectively. Reference numeral 61 denotes a buried oxide film for insulating devices from each other. Other reference numerals denote the same parts as in the foregoing drawings.

In this embodiment, an NMOSFET is used. The word line WL is constituted by the first gate polysilicon layer, and the portions 41 between the buried contacts 44 and the bit line contacts 45 are used as the channel regions of transfer gates. The n+-type diffusion layer 48 is used as the gate of the n-type TFT, and the second polysilicon layer 49 is used as the substrate of the TFT. As described above, when the n+-type diffusion layer 48 is used as the gate, a cell area can be considerably decreased by the following reasons compared with when a source or drain is formed on a diffusion layer side. That is, a cross wiring connecting portion is formed by the diffusion layer, a power supply line is formed by the diffusion layer, and a contact between a low-resistance line and the diffusion layer need not be formed, thereby largely reducing the cell area. In addition, since only one diffusion layer for forming TFTs is formed, a new gate polysilicon layer need not be formed, thereby reducing the number of wiring layers. The third polysilicon layer 51 is used as the gate of the p-type TFT, and the fourth polysilicon layer 53 is used as the substrate of the p-type TFT. As described above, since the p-type TFT is formed by using the third and fourth polysilicon layers, the p-type TFT can be formed on the upper layer of the n-type TFT, and the cell area is not increased.

The potentials of the inner nodes used for cross connection must be connected to the n-type TFT gate of the diffusion layer, the n-type TFT substrate of the second polysilicon layer, the p-type TFT gate of the third polysilicon layer, and the p-type TFT substrate of the fourth polysilicon layer. When three contacts between the diffusion layer and the second polysilicon layer, between the second polysilicon layer and the third polysilicon layer, and between the third polysilicon layer and the fourth polysilicon layer are formed to overlap each other at the same point, the wiring connections of the inner nodes (data storage nodes) can be formed at one point, and the cell area can be advantageously decreased. In addition, the n-type TFT gate of the diffusion layer overlaps the p-type TFT substrate of the third polysilicon layer, and the n-type TFT substrate of the second polysilicon layer overlaps the n-type TFT substrate of the fourth polysilicon layer, such that the two buried contacts of the inner nodes are diagonally opposite to each other. The first gate and substrate are arranged perpendicularly to the second gate and substrate to overlap the inner node of the second gate and substrate, and the second gate and substrate overlap the inner node of the first gate and substrate, thereby completing the cross connection. Therefore, a simple pattern layout can be obtained, and transistors can be efficiently arranged.

FIG. 5 shows a pattern layout corresponding to two cells according to still another embodiment of the present invention. This embodiment has a characteristic feature residing in that word lines 43 of two access transistors (transfer gates) are independently formed by a first polysilicon layer. Therefore, unlike in the arrangement in FIG. 4, two bit line contacts 45 need not be parallelly arranged on the short sides of the cell, and the lengths of the short sides ca be advantageously decreased.

Figure 6:
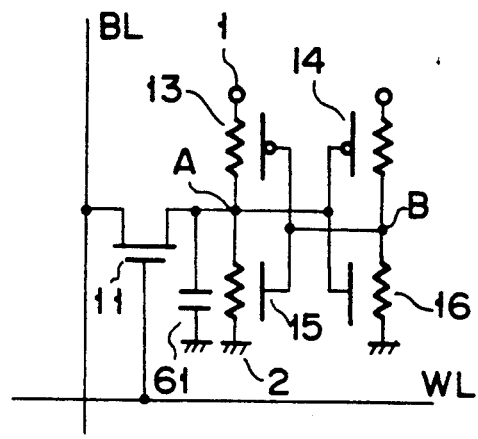
FIG. 6 is a circuit diagram showing still another embodiment of the present invention.
Figure 7:
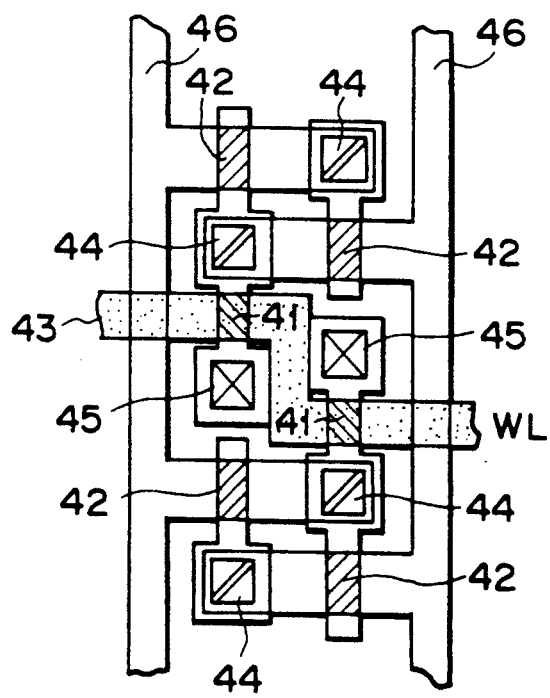
FIGS. 7, 8, and 9 are views of patterns showing other embodiments of the present invention.

FIG. 6 is a circuit diagram showing still another embodiment of the present invention, and FIG. 7 is a plan view of a pattern corresponding to two cells in FIG. 6. The same reference numerals as in FIG. 5 denote the same parts in FIGS. 6 and 7. Reference numeral 11 denotes an access transistor selectively controlled by a word line WL and serving as a transfer gate for connecting a bit line BL to an inner node A of a data storing section of a flip-flop; 61, a capacitor arranged between the inner node A of the flip-flop and a power supply line; 13 and 14, p-type TFTs; and 15 and 16, n-type TFTs. These TFTs 13 to 16 are cross-connected to each other to constitute the flip-flop. Since the TFTs are used as all the transistors for constituting the flip-flop, only one access transistor 11 is sufficient as a transistor to be formed on an Si substrate. The p- and n-type TFTs can be formed in a three dimensional structure by depositing polysilicon on an NMOS access transistor, and the cell area of this embodiment can be decreased to be smaller than that of a conventional static memory cell.

Since the flip-flop is constituted by the TFTs, the driving power of the cell is reduced, and the cell current is reduced to about 10 pA to 1 nA even though conventional cell current is several 100 μA. Therefore, the resistances of power supply lines 46 can be increased, and the standby current can be suppressed to the same level as that of conventional small standby current because the TFTs are used. Although a read access time may be prolonged due to the decrease in cell current, as in a DRAM cell, when the capacitor 61 is used, a sufficient bit line amplitude can be obtained by dividing the charge between the capacitor 61 and the bit line BL. Therefore, the read access delay can be minimum as compared with a conventional SRAM cell. As described above, the read access method of a DRAM is used as that of this embodiment. In a write access method, the current of the TFTs is decreased, and a time for causing the flip-flop to reach the bistable point is prolonged. For this reason, when data "1" is to be written in a cell in which data "0" has been written, since the potential of the inner node A must be higher than that of the cell power supply, the potentials of the bit line BL and the word line WL ar boosted to sufficiently increase the potential of the inner node. When data "0" is to be written in a cell in which data "1" has been written, the transistor size W of the p-type TFT 14 is larger than that of the TFT 13, or a threshold value voltage Vth is decreased, such that the n-type TFT 15 must be turned on as early as possible.

FIG. 7 shows a pattern layout corresponding to two static memory cells according to the embodiment of the present invention. NMOSFETs are used in this embodiment. The word line WL is constituted by a first gate polysilicon layer, portions 41 between the bit line contacts 45 and the buried contacts 44 are used as the channel regions of the transfer gate 11. As in the above embodiment, the gate of the n-type TFT is constituted by an $n^+$-type diffusion layer, and the second polysilicon layer is used as the substrate of the TFT. As described above, when the $n^+$-type diffusion layer is used as the gate, cell area can be considerably decreased by the following reasons compared with the case where a source or drain is formed on a diffusion layer side. That is, a wiring portion of cross connection is formed by the diffusion layer, a power supply line is formed by the diffusion layer, and a contact between a low-resistance line and the diffusion layer need not be formed, thereby largely reducing the cell area. In addition, since only one diffusion layer for forming TFTs is required, a new gate polysilicon layer need not be arranged, and the number of wiring layers can be reduced. The third polysilicon layer is used as the gate of a p-type TFT, and the fourth polysilicon layer is used as the substrate of the p-type TFT. As described above, since the p type TFT is formed by using the third and fourth polysilicoon layers the p-type TFT can be formed on the upper layer of the n-type TFT. and the cell area is not increased.

The potentials of the inner nodes used for cross connection must be connected to the n-type TFT gate of the diffusion layer, the n-type TFT substrate of the second polysilicon layer, the p-type TFT gate of the third polysilicon layer, and the p-type TFT substrate of the fourth polysilicon layer. When three contacts between the diffusion layer and the second polysilicon layer, between the second polysilicon layer and the third polysilicon layer, and between the third polysilicon layer and the fourth polysilicon layer are formed to overlap each other at the same point, the wiring connections of the inner nodes can be formed at one point, and the cell area can be advantageously decreased.

In addition, the n-type TFT gate of the diffusion layer overlaps the p-type TFT substrate of the third polysilicon layer, and the n-type TFT substrate of the second polysilicon layer overlaps the n-type TFT substrate of the fourth polysilicon layer, such that the two buried contacts of the inner nodes are diagonally opposite to each other. The first gate and substrate are arranged perpendicularly to the second gate and substrate to overlap the inner node of the second gate and substrate, and the second gate and substrate overlap the inner node of the first gate and substrate, thereby completing cross connection. Therefore, a simple pattern layout can be obtained, and transistors can be efficiently arranged.

Figures 8, 9:
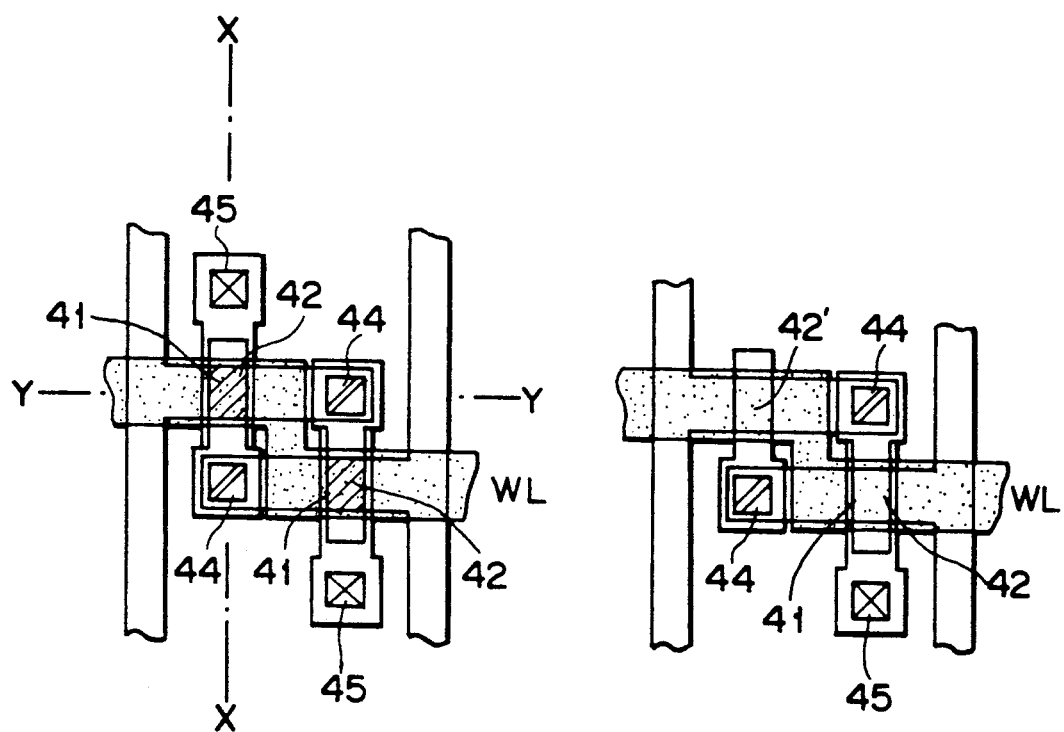

The present invention is not limited to the above embodiments, and various changes and modifications can be effected. For example, although an NMOSFET is formed on a semiconductor substrate in the above embodiments, a PMOSFET may be formed on the semiconductor substrate as an access transistor. However, in this case, a p-type T diffusion layer is used as a gate of the p-type TFT, the second polysilicon layer is used as the substrate of the p-type TFT, the third polysilicon layer is used as the gate of the n-type TFT, and the fourth polysilicon layer is used as the substrate of the n-type TFT. According to the present invention, a first polysilicon layer may be used as the gate of a transfer gate, a second polysilicon layer may be used as the gate of a TFT of a second conductivity type, a third polysilicon layer may be used as the substrate of the TFT of the second conductivity type, a fourth polysilicon layer is used as the gate of a TFT of a first conductivity type, and a fifth polysilicon layer may be used as the substrate of the TFT of the first conductivity type. FIG. 8 is a plan view of a pattern showing this arrangement and shows a modification of FIGS. 4A, 4B, 4C, 4D and 5. As the characteristic feature of this modification, a TFT flip-flop rides on a word line WL of a first polysilicon layer. For this reason, the cell area is smaller than those of the embodiments in FIGS. 4A, 4B, 4C, 4D, and 5. However, in this case, since the diffusion layer 48 (in FIG. 4) cannot be used as the gate of a TFT, processing using five polysilicon layers must be performed. In FIG. 8, two portions at which transistors 41 and 42 (reference numerals 42 denote a p-type TFT and an n-type TFT) overlap each other are formed. According to the present invention, in the circuit arrangement in FIG. 6, as shown in FIG. 9, a memory cell may be formed such that flip-flops ride on a word line WL, as in FIG. 8. This memory cell has only one transfer gate 41 and corresponds to a modification of the memory cell in FIG. 7. In this case, the diffusion layer 48 (FIG. 4) is used for only a transfer gate, and the additive polysilicon layer acts as a TFT gate.

Figure 10A:
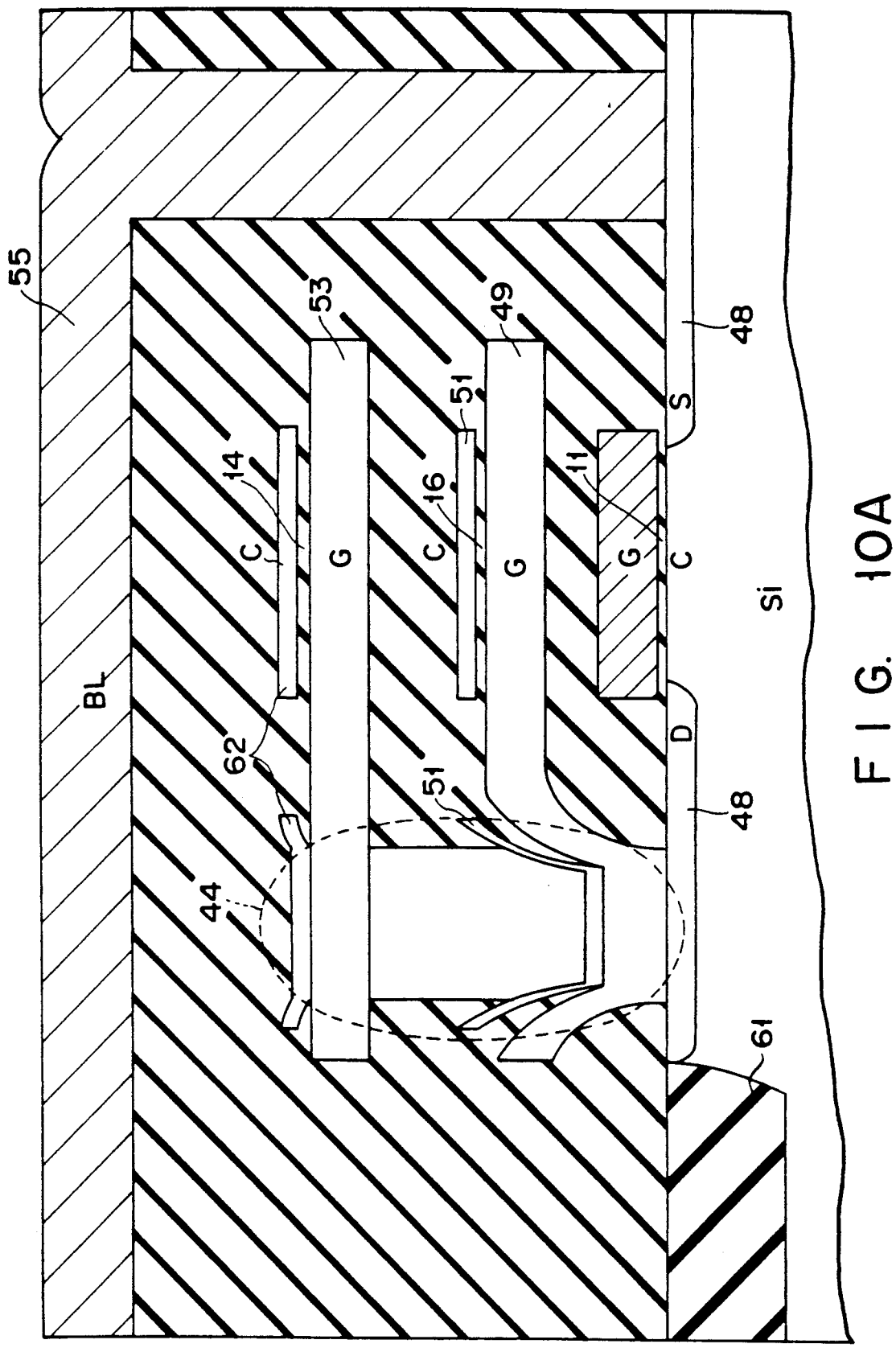
FIGS. 10A and 10B are sectional views showing still another embodiment of the present invention.
Figure 10B:
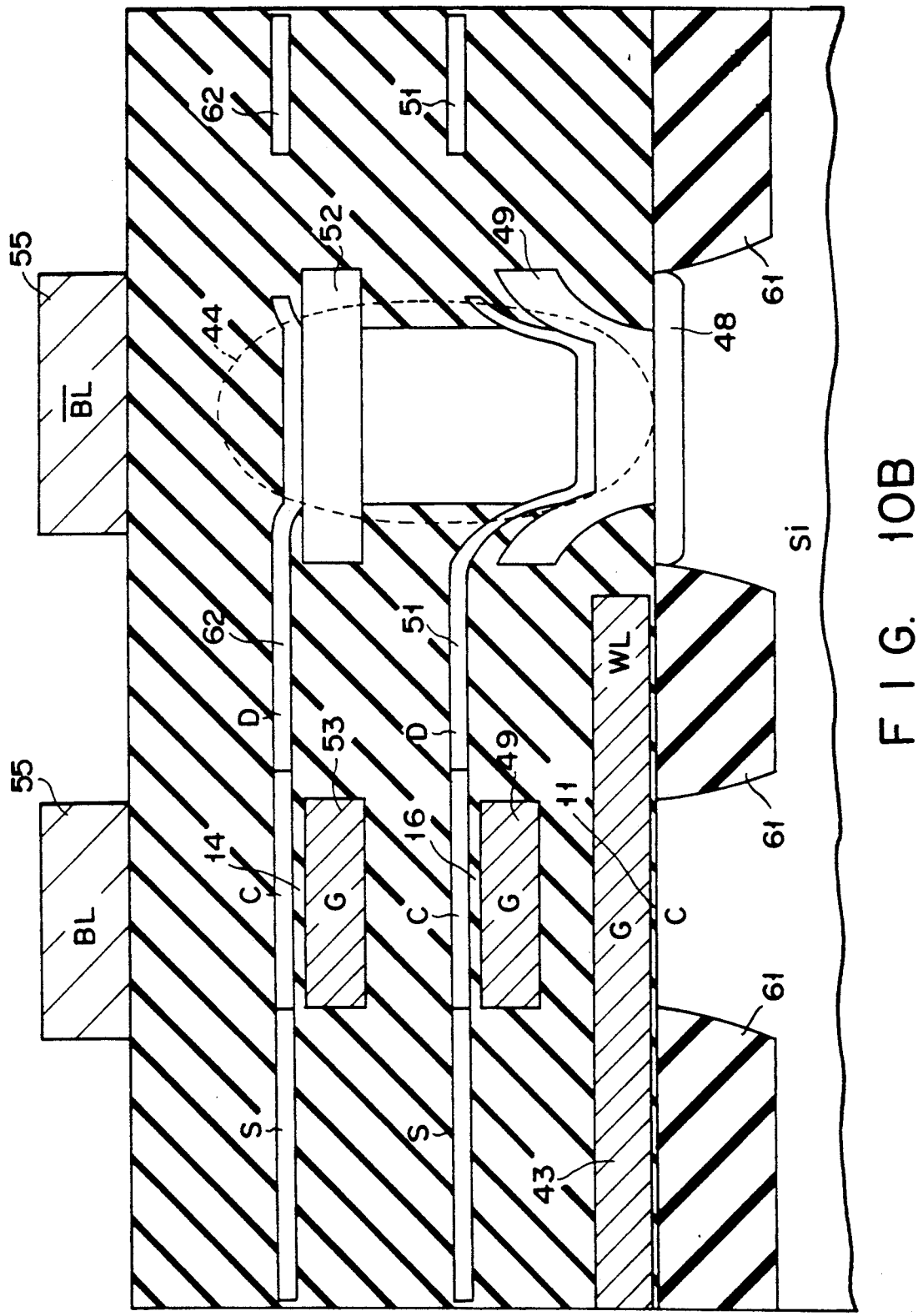

FIGS. 10A and 10B are sectional views of the two-dimensional pattern along the X- and Y-directions in FIG. 8, respectively. In FIGS. 10A and 10B, reference numerals 11, 14, and 16 denote transistors shown in FIG. 1 or the like. Reference numeral 61 denotes a buried oxide film for insulating devices from each other. Reference numeral 62 denotes a fifth polysilicon layer which is newly formed to form the TFTs 14 and 16 immediately above a transistor 11. Other reference numerals in FIGS. 10A and 10B denote the same parts as in the foregoing drawings.

As described above, according to the present invention, although four MOS transistors must be formed on an Si substrate in a conventional method, only one or two MOS transistors are required. When only a TFT is stacked on the substrate, a cell area can be decreased. In addition, the following advantages can be obtained. That is, the resistance of a power supply line can be increased, and an increase in operation time can be minimized by adding a capacitor. A potential difference between bit lines can be kept to be large, and data of a data storage node can be hard to be broken.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A semiconductor static data memory apparatus comprising:
    a first power supply terminal;
    a second power supply terminal;
    a first TFT (thin film transistor), said first TFT having a first conductivity type, and said first TFT including one terminal connected to said first power supply terminal and another terminal connected to a first data storage node for memorizing the data;
    a second TFT, said second TFT having the first conductivity type, and said second TFT including one terminal connected to said first power supply terminal and another terminal connected to a second data storage node for memorizing the data;
    a third TFT, said third TFT having a second conductivity type, and said third TFT including one terminal connected to said second power supply terminal and another terminal connected to said first data storage node;
    a fourth TFT, said fourth TFT having the second conductivity type, and said fourth TFT including one terminal connected to said second power supply terminal and another terminal connected to said second data storage node;
    data bit line which are inverted with respect to each other;
    first switching means for performing a switching operation between a first one of said bit lines and said first data storage node;
    second switching means for performing a switching operation between a second one of said data bit lines and said second data storage node; and
    word line means, connected to gates of said first and second switching means, for controlling operations of said first and second switching means;
    wherein a gate of said first TFT is connected to said second storage node and a gate of said third TFT, and a gate of said second TFT is connected to said first data storage node and a gate of said fourth TFT, such that a flip-flap circuit is formed by said first power supply terminal, said second power supply terminal, said first TFT, said second TFT, said third TFT, and said fourth TFT.

2. An apparatus according to claim 1, wherein at least one pair of said first, second, third, and fourth TFTs are three-dimensionally formed on said first and second switching means to partially overlap each other.

3. An apparatus according to claim 1, wherein said first, second, third and fourth TFTs are three-dimensionally formed on said first and second switching means to overlap each other.

4. An apparatus according to claim 1, further comprising:
    a capacitor formed between said first and second storage nodes.

5. An apparatus according to claim 1, further comprising:
    capacitors formed between said first and second storage nodes and said second power supply terminal, respectively.

6. An apparatus according to claim 1, wherein said apparatus includes a first polysilicon layer and a second polysilicon layer formed on a semiconductor substrate through insulating means.

7. An apparatus according to claim 6, wherein said apparatus includes a third polysilicon layer and a fourth polysilicon layer formed on said first and second polysilicon layers through said insulating means.

8. An apparatus according to claim 7, wherein said first polysilicon layer serves as a gate of said first switching means, said second polysilicon layer serves as the gate of said third TFT, said third polysilicon layer serves as a silicon substrate for forming said third TFT, and said fourth polysilicon layer serves as the gate of said first TFT.

9. An apparatus according to claim 1, wherein a layer for forming the gate of said third TFT forms a layer of the second conductivity type of said first switching means, and a layer for forming the gate of said fourth TFT forms said layer of the second conductivity type of said second switching means.

10. An apparatus according to claim 8, further comprising;
means which extends through said second, third, and fourth polysilicon layers perpendicularly to said silicon substrate to connect the layers.

11. A semiconductor static data memory apparatus comprising:
a first power supply terminal;
a second power supply terminal;
a first TFT (thin film transistor), said first TFT having a first conductivity type, and said first TFT including one terminal connected to said first power supply terminal and another terminal connected to a first data storage node for memorizing the data;
a second TFT, said second TFT having the first conductivity type, and said second TFT including one terminal connected to said first power supply terminal and another terminal connected to a second data storage node for memorizing the data;
a third TFT, said third TFT having a second conductivity type, and said third TFT including one terminal connected to said second power supply terminal and another terminal connected to said first data storage node;
a fourth TFT, said fourth TFT having the second conductivity type, and said fourth TFT including one terminal connected to said second power supply terminal and another terminal connected to said second data storage node;
data bit lines which are inverted with respect to each other;
switching means for performing a switching operation between one of said bit lines and said first data storage node; and
word line means, connected to a gate of said switching means, for controlling an operation of said switching means;
wherein a gate of said first TFT is connected to said second data storage node and a gate of said third TFT, and a gate of said second TFT is connected to said first data storage node and a gate of said fourth TFT, such that a flip-flip circuit is formed by said first power supply terminal, said second power supply terminal, said first TFT, said second TFT, said third TFT, and said fourth TFT.

12. An apparatus according to claim 11, further comprising:
a capacitor formed between said first data storage node and said second power supply terminal.

13. An apparatus according to claim 11, wherein, in said third and fourth TETs, a driving power of said third TFT connected to said switching means is set to be larger than that of said fourth TFT.

14. An apparatus according to claim 13, wherein the driving powers of said third and fourth TFTs have a difference due to a difference between sizes of said third and fourth TFTs.

* * * * *